United States Patent
Champion et al.

(10) Patent No.: US 7,777,403 B2
(45) Date of Patent: Aug. 17, 2010

(54) PHOTONIC-CRYSTAL FILAMENT AND METHODS

(75) Inventors: David Champion, Lebanon, OR (US); Gregory S. Herman, Albany, OR (US); Hubert A. Vander Plas, Corvallis, OR (US); David M. Schut, Philomath, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1256 days.

(21) Appl. No.: 10/767,732

(22) Filed: Jan. 28, 2004

(65) Prior Publication Data

US 2005/0160964 A1 Jul. 28, 2005

(51) Int. Cl.
*H01J 1/62* (2006.01)
*H01J 63/04* (2006.01)
*H01J 9/00* (2006.01)

(52) U.S. Cl. .................. 313/345; 313/501; 313/271; 313/495; 445/24; 445/20; 117/2; 427/376.1

(58) Field of Classification Search .............. 117/2; 313/345
See application file for complete search history.

(56) References Cited

U.S. PATENT DOCUMENTS

| | | | |
|---|---|---|---|
| 3,604,970 A | 9/1971 | Culbertson et al. | |
| 5,172,267 A | 12/1992 | Yablonovitch | |
| 5,268,249 A * | 12/1993 | Saha et al. | 252/62.63 |
| 5,335,240 A | 8/1994 | Ho et al. | |
| 5,349,265 A | 9/1994 | Lemelson | |
| 5,406,573 A | 4/1995 | Ozbay et al. | |
| 5,440,421 A | 8/1995 | Fan et al. | |
| 5,600,483 A | 2/1997 | Fan et al. | |
| 5,651,818 A | 7/1997 | Milstein et al. | |
| 5,997,795 A | 12/1999 | Danforth et al. | |
| 5,998,298 A | 12/1999 | Fleming et al. | |
| 6,139,626 A | 10/2000 | Norris et al. | |
| 6,358,653 B1 | 3/2002 | Turberfield et al. | |
| 6,358,854 B1 | 3/2002 | Fleming et al. | |
| 6,392,787 B1 | 5/2002 | Cirelli et al. | |
| 6,468,823 B1 | 10/2002 | Scherer et al. | |
| 6,596,224 B1 * | 7/2003 | Sachs et al. | 419/6 |
| 6,768,256 B1 * | 7/2004 | Fleming et al. | 313/501 |
| 2002/0154403 A1 | 10/2002 | Trotter, Jr. | |
| 2003/0175411 A1 * | 9/2003 | Kodas et al. | 427/58 |
| 2004/0255841 A1 * | 12/2004 | Enokido et al. | 117/2 |

(Continued)

FOREIGN PATENT DOCUMENTS

JP 2000-258650 A 9/2000

(Continued)

OTHER PUBLICATIONS

Lerner. "Brighter lights from photonic crystals" Indust. Physicist (Aug./Sep. 2002) p. 13.

(Continued)

*Primary Examiner*—Nimeshkumar D Patel
*Assistant Examiner*—Natalie K Walford

(57) ABSTRACT

A photonic-crystal filament is formed by mixing a slurry comprising particles of substantially uniform size and a precursor material for a desired metal, urging the slurry through an orifice to force the particles and precursor material into a combination having a desired crystallographic configuration, drying the combination emerging from the orifice, and sintering the precursor material.

33 Claims, 4 Drawing Sheets

U.S. PATENT DOCUMENTS

2005/0172673 A1* 8/2005 Oh et al. ................... 65/393
2006/0081171 A1* 4/2006 Enokido .................... 117/2

FOREIGN PATENT DOCUMENTS

| JP | 2000-284136 A | 10/2000 |
|---|---|---|
| JP | 2000-314817 A | 11/2000 |
| JP | 2002-323631 A | 11/2002 |
| JP | 2002-323632 A | 11/2002 |

OTHER PUBLICATIONS

Hewitt, "Moulds Cut Photonic Crystal Costs" May 16, 2002 http://nanotechweb.org/articles/news/1/5/8/1.

Anon."Tungsten filam . . . "The Hindu May 9, 2002 http://www.hinduonnet.com/thehindu/seta/2002/05/09/stories/.

Fleming et al."All-metallic three-dimensional photonic . . . " Nature V. 417 (May 2, 2002), p. 52-55.

Service, "Building Better Photonic Crystals" Science V. 295 (Mar. 29, 2002) p. 2399.

Anon. "Si-based photonic . . . " http://fisicavolta.unipv.it/dipartimento/ricerca/fotonici/Cofin...pdf, published 2002.

Vlasov et al. "On-chip natural assembly of silicon photonic . . . " Nature, V. 414 (Nov. 15, 2001), p. 289 ff.

Lin et al. "Silicon Three-dimensional Photonic . . . " Sandia National Lab report SAND2001-3612 (Nov. 2001).

Gasser et al. "Real-Space Imaging of Nucleation and Growth . . . " Science V 292 (Apr. 13, 2001) pp. 258-262.

Norris et al. "Chemical Approaches to Three-Dim . . . " Adv. Mater., V. 13 (6) (Mar. 16, 2001). pp. 371-376.

Parker et al. "Photonic Crytstals" Aug. 2000 http://physicsweb.org/article/world/13/8/9/1.

Wang et al. "Direct nanoimprint of submicron . . . " Appl. Phys. Let. V. 75 (18) (Nov. 1, 1999) pp. 2767-2769.

Vlasov et al. "Synthesis of Photonic Crystals . . . " Adv. Mater., V. 11 (2) (1999) pp. 165-169.

Astratov et al. "Photonic band gaps in 3D ordered fcc . . . " Phys. Let. A 222 (Nov. 11, 1996) pp. 349-353.

McGurn et al. "Photonic band structures of two- . . . " Phys. Rev. B, V. 48(23) Dec. 15, 1993 pp. 17576-17579.

Yablonovitch et al. "Photonic Band Structure:" Phys. Rev. Letters V. 67(17) Oct. 21, 1991, pp. 2295-2298.

Ho et al. "Existence of a Photonic Gap . . . " Phys. Rev. Letters V. 65(25) Dec. 17, 1990. pp. 3152-3155.

* cited by examiner

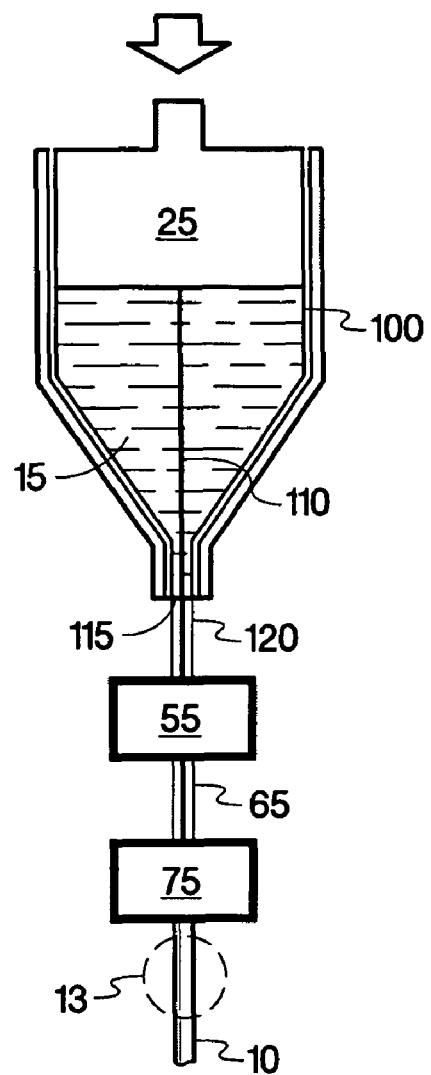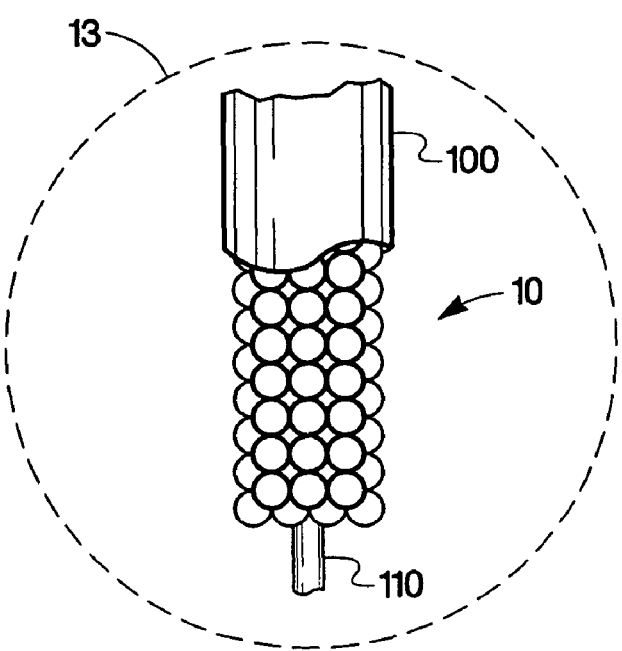
Fig. 3A
Fig. 3B

PHOTONIC-CRYSTAL FILAMENT AND METHODS

TECHNICAL FIELD

This invention relates generally to photonic-crystal filaments and to methods for making and using photonic-crystal filaments.

BACKGROUND

Photonic crystals are spatially periodic structures having useful electromagnetic wave properties, such as photonic bandgaps. In principle, the spatial periodicity of a photonic crystal can be in one, two, or three dimensions. There is especially high interest in developing technology of artificial photonic crystals that are useful in new and improved functional photonic devices, especially for the infrared and visible-light portions of the electromagnetic spectrum. Functional devices using photonic crystals, such as selective reflectors, filters, optical couplers, resonant cavities, delay lines, and waveguides have been proposed and/or fabricated.

Several methods for forming artificial photonic crystals are known. Multilayered dielectric films have been used to make one-dimensional photonic crystals along the dimension perpendicular to the films.

Three-dimensional photonic crystals have been formed by stacking and bonding wafers in which periodic structures have been micromachined by etching. Such methods result in structures called "wood-pile" or "picket-fence" structures because the stacked elements have an appearance similar to stacked square timbers. Such methods require precise alignment of the micromachined wafers to be bonded together, which becomes more difficult as the number of layers increases and as the dimensions of micromachined features are reduced.

Some of the known methods for forming artificial photonic crystals work by modifying refractive index periodically in a material originally having a uniform refractive index. For example, light-wave interference or holography has been used to create periodic variations of refractive index within photosensitive materials, such as photoresist, to make photonic crystals. Perhaps the simplest methods for forming a one- or two-dimensional photonic crystal are those methods that form a periodic or quasi-periodic array of holes in a uniform slab of material. A vacuum or material filling the holes has a different index of refraction from the base material of the slab. In the background art, such holes have been formed by micromachining or by nanoscale lithography, such as electron-beam or ion-beam lithography. Conversely, such charged-particle beam lithography has also been used to selectively assist deposition of material to form spaced elements of the photonic crystal. Some photonic crystals have been formed by self-assembly of very small particles provided in a colloidal suspension. In some cases, the interstitial spaces between the colloidal particles have been filled with a second material of a different refractive index. In some of those cases, the colloidal particles themselves have been removed to leave an "inverse" photonic crystal in which the crystal lattice positions are occupied by voids in a matrix of the second material.

Photonic-crystal filaments have been proposed to exploit the bandgap properties of photonic crystals for improving the luminous efficiency of lamp filaments, reducing the amount of infrared emission in favor of increased emission of visible-light wavelengths. Prototype photonic crystals for such purposes have been fabricated by extensions of known Micro Electro-Mechanical Systems (MEMS) technology. Technology for making suitable metallic photonic crystals is disclosed, for example, in the article by J. G. Fleming et al., "All-metallic three-dimensional photonic crystals with a large infrared bandgap," Nature V. 417, No. 6884 (May 2, 2002), pp. 52-54.

While all of these methods and others have been used successfully to make photonic crystals in various forms, the need for efficient methods of mass-production and the particular requirements associated with filamentary photonic crystals, especially for use in lighting applications, create a need for fabrication methods specially adapted for photonic-crystal filaments.

BRIEF DESCRIPTION OF THE DRAWINGS

The features and advantages of the disclosure will readily be appreciated by persons skilled in the art from the following detailed description when read in conjunction with the drawings, wherein:

FIG. 3A is a side elevation view of an apparatus according to an embodiment of the invention.

FIG. 3B is an enlarged detail side elevation view of a photonic-crystal filament according to an embodiment of the invention.

DETAILED DESCRIPTION OF EMBODIMENTS

Figure 1:
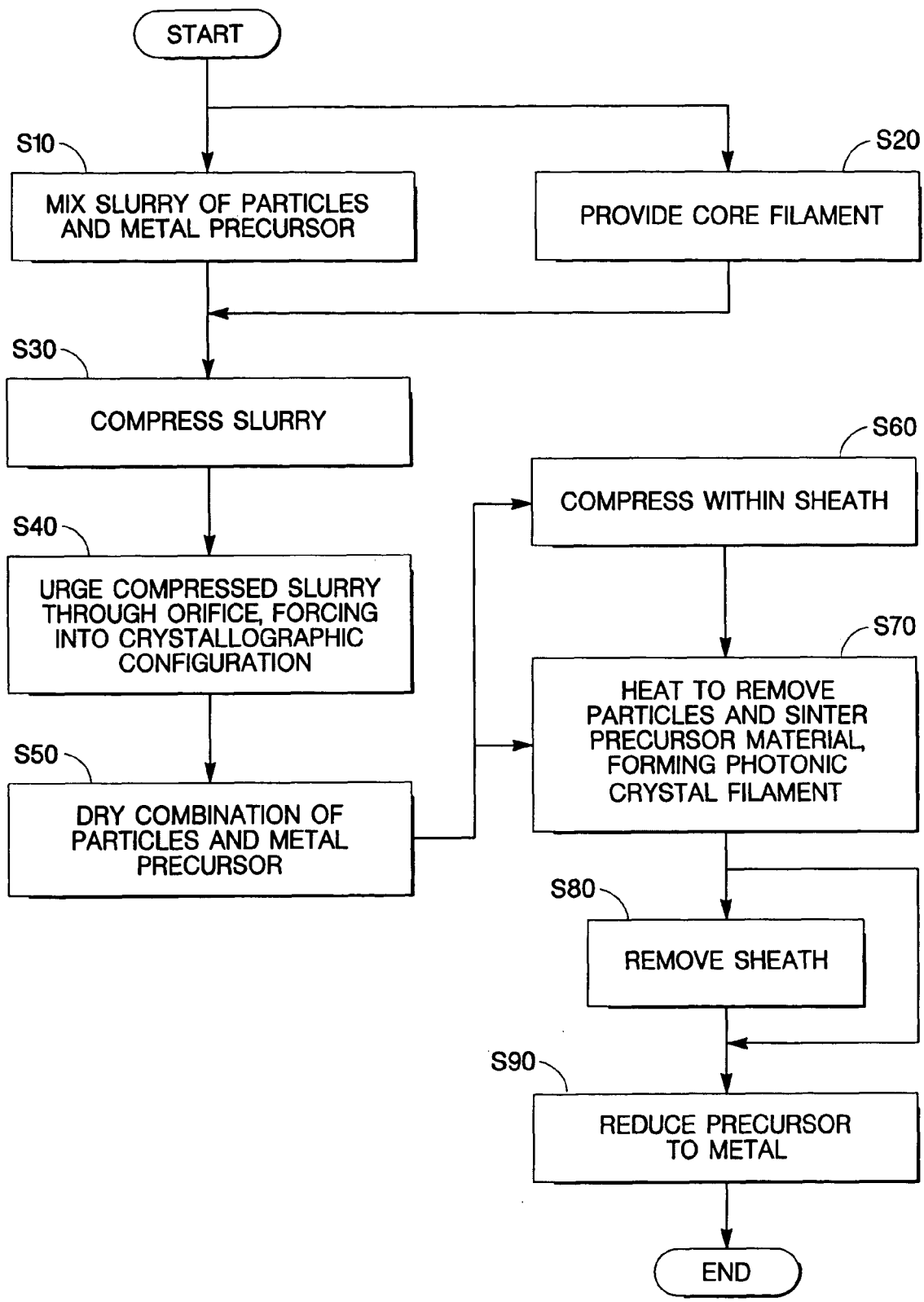
FIG. 1 is a flow chart illustrating a method according to an embodiment of the invention.

For clarity of the description, the drawings are not drawn to a uniform scale. In particular, vertical and horizontal scales may differ from each other and may vary from one drawing to another. While the drawings of various embodiments are shown with specific numbers of particles within a filament diameter, such numbers of particles are chosen only for clarity of illustration, and the invention should not be construed as being limited to such constructions. The number of crystallographic lattice sites occupied by particles or voids may be greater or less than shown in the drawings.

Throughout this specification and the accompanying claims, the term "precursor" or "precursor material" refers to an elemental metal or to a metal compound that can be converted to the desired elemental metal by a suitable treatment. The term "matrix" as used herein refers to more or less continuous matter in which something (e.g., particles or voids) is embedded. The prefix "nano-" and the term "nanoscale" are used herein to denote sizes of less than about one micrometer. For example, the term "nanosphere" refers to a sphere whose diameter is less than about one micrometer. The term "drying" is used to denote either an "active" method such as application of heat and/or gas flow or a "passive" method such as allowing a substance to dry. For example, a passive method may include allowing sufficient passage of time while the substance is located in an environment suitable for drying. The phrase "substantially uniform size" used in referring to a particle size distribution means that any variation in particle size from the mean or median particle size is not a large enough variation to prevent the particles from being arranged in a crystallographic configuration having a photonic bandgap. Known methods of preparing monodisperse particles may be used to prepare particles of substantially uniform size in the sense of that phrase used here.

One aspect of embodiments of the invention is a photonic-crystal filament formed by compressing, extruding, and drying a slurry comprised of particles and a precursor metal compound, heating the dried slurry, and (if necessary) reducing the precursor metal compound to metal. The slurry may surround a core filament. The slurry may be located within a metal sheath and may be compressed while located within the metal sheath. Furthermore, the sheath may be drawn through one or more dies.

FIG. 1 is a flow chart illustrating embodiments of a method performed in accordance with the invention. Various steps of the method are denoted by reference numerals S10, . . . , S90. In step S10, a slurry of particles and a precursor for a metal is mixed. As mentioned above, the precursor may be the elemental metal itself. If a core filament is to be used, it is provided in step S20. In step S30, the slurry may be compressed. In step S40, the compressed slurry is urged through an orifice, forcing the particles into a crystallographic configuration. For example, the orifice used may have a suitable size relative to the particle size, such that the particles are forced into a close-packed arrangement when they pass thru the orifice, each particle being forced into contact with the maximum possible number of other particles. The resultant crystallographic configuration may be a hexagonal-close-packed or face-centered-cubic (FCC) configuration, for example. The orifice may also be suitably shaped, e.g., in a hexagonal shape, but the orifice shape is not generally critical.

The desired metal may be a refractory metal such as tungsten, platinum, tantalum, molybdenum, and their alloys. Thus, for example, the precursor material may comprise a fine powder of any of these refractory metals in their elemental form, an oxide of a refractory metal such as tungsten, or peroxopolytungstic acid. If the precursor material comprises the elemental form of a metal, the step of reducing the precursor material to metallic form is not necessary. If the precursor material comprises a fine metal powder, the powder size should be smaller than the size of the other particles used in the slurry, so as to fit readily into interstices between the other particles.

In step S50, the combination of particles and metal precursor is dried (e.g., allowed to dry). If a sheath is to be used, the dried combination is compressed within a sheath in step S60. In step S70, the combination is heated to sinter the precursor material, forming the basic structure of the photonic-crystal filament. If the particles are to be removed, the heating of step S70 may also be used to remove the particles. In step S80, the sheath (if present) may be removed, e.g., by chemical etching. In step S90 (if necessary), the precursor material may be reduced to a metallic form. If the precursor material is the elemental metal itself, then reduction is not necessary.

Thus, another aspect of the invention is an embodiment of a method for forming a photonic-crystal filament. This method embodiment may comprise steps of mixing a slurry comprising particles of substantially uniform size and a precursor material for a desired metal, urging the slurry through an orifice to force the particles and precursor material into a combination having a desired crystallographic configuration, drying the combination emerging from the orifice, and heating the dried combination to sinter the precursor material, whereby a photonic-crystal filament is formed. Optionally, with suitable combinations of particle material and heating temperatures, the heating of the dried combination may also be used to remove the particles while sintering the precursor material. The slurry may be compressed to urge the slurry thorough the orifice. The size of the orifice may be chosen to provide a desired diameter of the photonic-crystal filament to be formed, e.g., 100 micrometers. The shape of the orifice may be round, square, hexagonal, or some other desired shape. The slurry may include a liquid such as water, alcohol, or mixtures thereof in an amount sufficient to provide fluidity of the slurry.

The particles may comprise an inert material, such as substantially uniform spheres of a polymer such as polystyrene. The particles may be nano-scale particles (i.e., less than about one micrometer diameter). The slurry may be prepared as a solgel. The precursor material may comprise a metal oxide, such as an oxide of tungsten. A particular example of a suitable precursor material is peroxopolytungstic acid ($2WO_3 \cdot H_2O_2 \cdot nH_2O$). Drying of the slurry may be done at temperatures below 200° C. Heating the dried combination to remove the particles (while sintering the remainder of the combination) may be done at temperatures in a range from about 600° C. to about 2500° C., depending on the metal and its precursor substance. A non-oxidizing atmosphere may be used to prevent undesired oxidation. The polymer particles, such as polystyrene spheres, are pyrolyzed at such temperatures, leaving spherical voids in their places. This removal of the particles leaves an "inverse" photonic crystal in which the crystal lattice positions are occupied by voids in a matrix of the metal material.

In other embodiments, the voids left by removal of the particles may be filled with another material by chemical vapor deposition (CVD). In still other embodiments, the composition of the particles, e.g., a ceramic material, may be chosen to withstand the sintering temperatures, and the particles may be left in place. It is also noted that neither the particles nor the voids have to be spherical, and it may be desired to use non-spherical particles in order to avoid symmetry-induced degeneracy in the Brillouin zone. Otherwise, in certain cases (face-centered-cubic structures, for example), such degeneracy can allow a pseudo-gap instead of a full photonic bandgap.

Figure 2A:
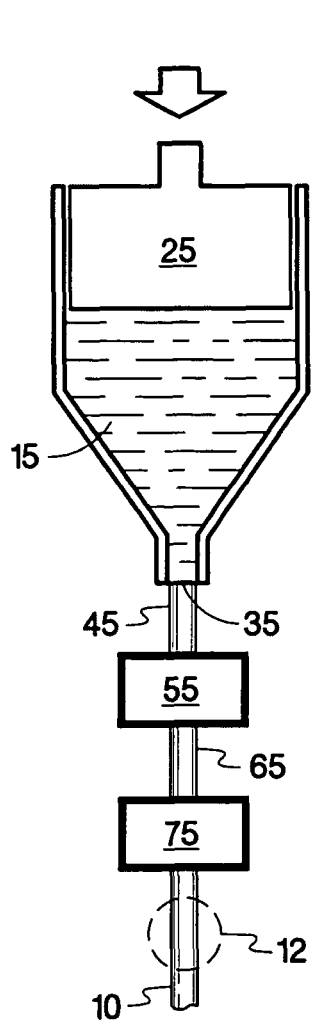
FIG. 2A is a side elevation view of an apparatus according to an embodiment of the invention.
Figure 2B:
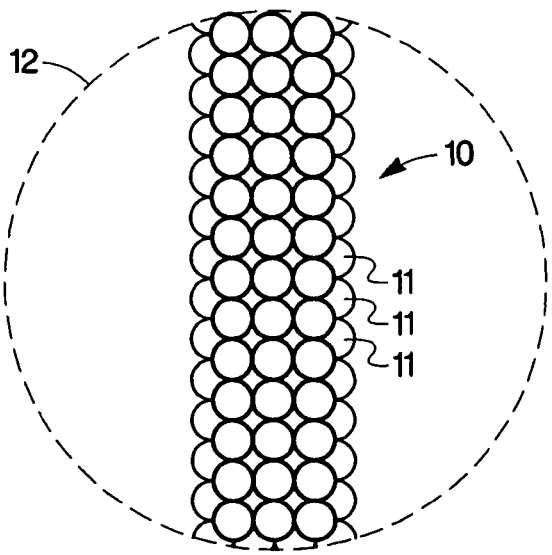
FIG. 2B is an enlarged detail side elevation view of a photonic-crystal filament according to an embodiment of the invention.
Figure 2C:
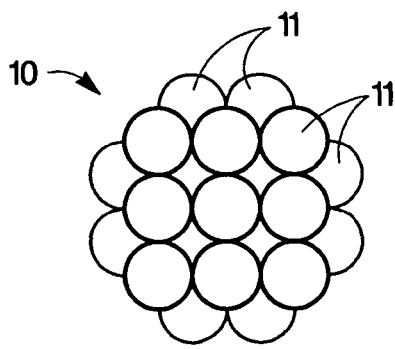
FIG. 2C is a top plan view of a segment of a photonic-crystal filament shown in FIG. 2A.
Figure 2D:
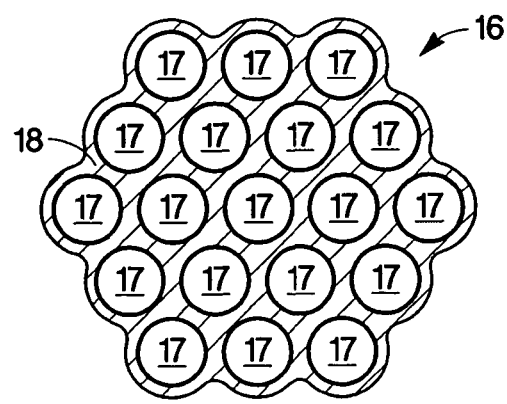
FIG. 2D is an axial cross-sectional view of a segment of a photonic-crystal filament according to an embodiment of the invention.

FIG. 2A is a side elevation view of an embodiment of apparatus made in accordance with the invention, showing a segment 12 of an embodiment of a photonic-crystal filament 10 made with the apparatus. FIG. 2B is an enlarged detail side elevation view of the segment 12 shown in FIG. 2A of the photonic-crystal filament 10. The slurry 15 is compressed using a ram 25 at high pressure and is extruded through a small orifice 35. The particles are forced into an ordered crystal structure, e.g., a cubic crystal structure. The emerging combination 45 (shown in FIG. 2A as moving downward) is dried. In the embodiment shown in FIG. 2A, the drying is performed in the ambient air. If the slurry is a solgel, exposure to moisture in the air may harden the combination. The dried combination is heated in a furnace 55 to sinter the precursor material and optionally to remove the particles by pyrolysis. The resulting structure 65 may be heated in a second furnace 75 containing a reducing atmosphere, as described below, to reduce the remaining matrix of precursor material to metallic form. The completed photonic-crystal filament 10 emerges (as shown at the bottom of FIG. 2A). The greatly enlarged detail 12 shown in FIG. 2B and the corresponding top view of FIG. 2C illustrate the arrangement of the particles 11. As described above, this removal of the particles leaves an "inverse" photonic crystal in which the crystal lattice positions are occupied by voids in a matrix of the metal material of photonic-crystal filament 10. FIG. 2D is an axial cross-sectional view of a segment of a photonic-crystal filament 16 according to such an embodiment of the invention. Voids 17 that remain after removal of the particles 11 occupy the lattice positions that were occupied by particles 11. The voids 17 are surrounded by matrix material 18.

Thus, in various embodiments, the crystallographic lattice positions may be occupied by solid particles 11, as shown in FIGS. 2B and 2C or by voids 17, as shown in FIG. 2D.

For some applications a method embodiment generally like the method embodiment described above may also include a step of reducing the precursor material to metallic form, for example by heating the precursor material in a reducing environment. For such cases, the structure 65 resulting from the pyrolysis is heated in a second furnace 75 (shown in FIG. 2A). The second furnace 75 may contain a reducing atmosphere to reduce the matrix of precursor material to metallic form. The reducing atmosphere environment may comprise a gas such as hydrogen, forming gas, a carbide gas, acetylene, or mixtures of these gases.

In another method embodiment, a core filament is provided and fed through the orifice while urging the compressed slurry through the orifice to force the particles and precursor material into a combination surrounding the core filament. A variation of that method includes passing an electric current through the core filament to heat the core filament. The electric current may be used to heat the precursor material to an effective temperature for sintering the precursor material, or the electric current may be used to provide heat for a chemical vapor deposition process described below. In some embodiments, the core filament may be removed, for example, by selective chemical etching, after the precursor material is sintered.

For some applications, another method embodiment may be used, which also includes a step of compressing the precursor material within a sheath 100. FIG. 3A is a side elevation view of an embodiment of apparatus for this method. FIG. 3B shows an enlarged detail 13 of this embodiment of a photonic-crystal filament made in accordance with one embodiment of the invention.

FIG. 3A is analogous to FIG. 2A but incorporates added features to illustrate variations of the fabrication methods, including feeding a core filament to be coated by photonic-crystal material and/or including compressing the precursor material within a sheath 100. The sheath 100 may be a relatively soft ductile metal, such as copper. The precursor material may be compressed by drawing the sheath through a die 115 or by drawing the sheath with its contents through a series of two or more successively smaller dies. Only one die 115 is shown in FIG. 3A, but those skilled in the art will recognize that a set of successively smaller dies may be arranged in series. The emerging structure 120 has a sheath 100. While sheath 100 is shown in the drawings as a round sheath, die(s) 115 may be shaped to form a polygonal cross-section such as a square, rectangle or hexagon, or a thin ribbon. Sheath 100, if used, may be composed of a material that is permeable to gas evolved in the drawing, drying, and/or sintering processes, and sheath 100 may have a thickness suitable for escape of the gas.

The emerging structure may, if desired, have a metal core filament 110 fed from the center of the ram 25 through the center of the slurry 15 and through the center of the die(s) 115. The core filament may be a tungsten wire, for example, having a diameter smaller than the smallest orifice or die used in forming the photonic-crystal filament around the core filament. As mentioned above, the core filament may be heated by passing an electric current through it, e.g., during the sintering step of the process and/or during a CVD process for back-filling voids with another material. In the embodiment of FIGS. 3A and 3B, as in other embodiments described herein, the desired metal may comprise a refractory metal such as tungsten, platinum, tantalum, molybdenum, and their alloys, and the precursor material may comprise a fine powder of any of these refractory metals in their elemental form, an oxide of a refractory metal such as tungsten, or peroxopolytungstic acid for example. Again, if the precursor material comprises the elemental form of a metal, the step of reducing the precursor material to metallic form is not necessary. If the precursor material comprises a fine metal powder, the powder size should be smaller than the size of the other particles used in the slurry, so as to fit readily into the interstices between the other particles. Photonic-crystal filaments comprising metals that can be heated to temperatures above about 1,500° K have many applications, such as lighting and photovoltaic systems. The refractory metals are generally suitable for such applications.

The particles used in embodiments of the method may comprise polymer particles, e.g., polymer nanospheres, which may comprise polystyrene, polyethylene, polymethylmethacrylate (PMMA), latex, or combinations of these polymers, for example. In other embodiments, the particles may comprise silicon or other semiconductor particles, silicon oxide particles, or other metal particles. Methods for making spheres of sufficiently uniform size distribution are known in the art for the various suitable materials. The substantially uniform size of the particles is adapted to provide a desired photonic band-gap of the photonic-crystal filament. For example, the substantially uniform size of the particles may be chosen to be about one-quarter of the lower wavelength edge of the desired photonic band-gap. For many applications, the desired photonic band-gap may correspond to selected wavelengths between about 400 nanometers and about 7000 nanometers. For applications in which it is desired to enhance the amount of visible radiation from the photonic crystal in comparison with infrared radiation, the desired photonic band-gap may correspond to a range of infrared wavelengths between about 900 nanometers and about 7000 nanometers or to a narrower range of infrared wavelengths, e.g., between about 1200 nanometers and about 2000 nanometers. Thus, the polymer or other spheres may have corresponding diameters. For example, particles with a uniform diameter of about 300 nanometers may be used for some applications.

If the particles are removed, the remaining voids may be filled with another material differing in refractive index from the material of the matrix. The filling material may be deposited in the voids by chemical vapor deposition (CVD), for example. That CVD process may be aided by heating the sintered combination. For example, if a core filament is used, this heating may be accomplished by passing a current through the core filament. Otherwise, heating methods known in the art, such as laser heating, may be used.

Figure 4A:
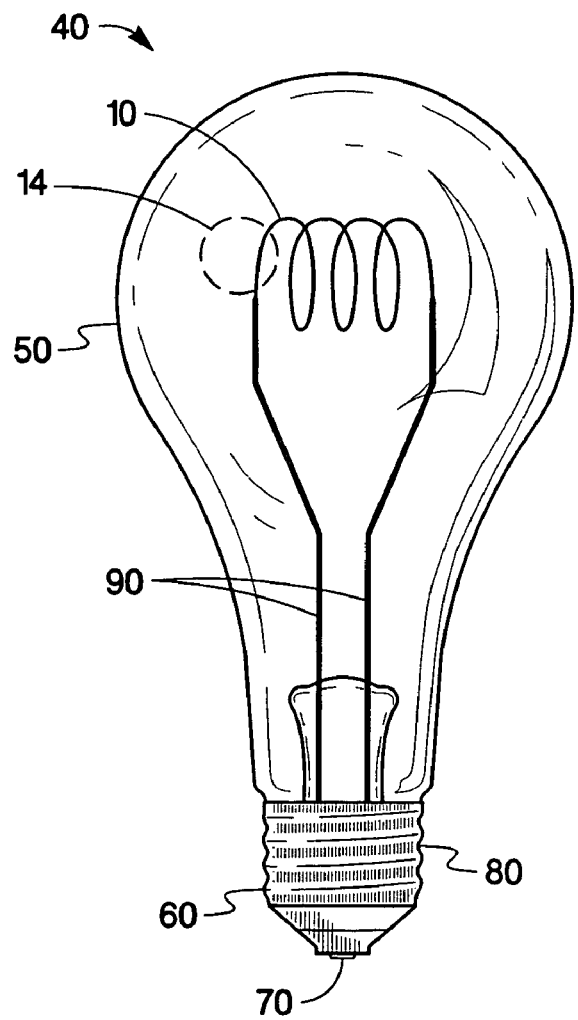
FIG. 4A is a side elevation view of a lamp incorporating a photonic-crystal filament according to an embodiment of the invention.
Figure 4B:
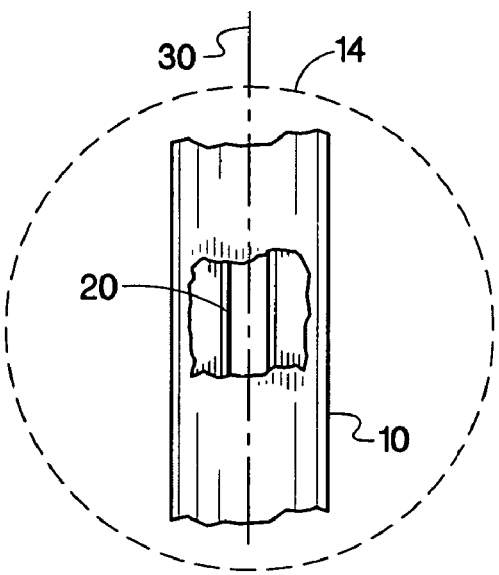
FIG. 4B is an enlarged detail portion of the photonic-crystal filament of FIG. 4A.

The photonic-crystal filament generally has a longitudinal axis 30 as shown in FIG. 4B, and a selected crystallographic axis of the crystallographic configuration may be aligned parallel to this longitudinal axis of the photonic-crystal filament. In the face-centered-cubic example described above, the (100) crystallographic axis of the face-centered-cubic crystallographic configuration is parallel to the orifice axis, and therefore parallel to the filament's longitudinal axis.

The methods described here for making photonic-crystal filaments may be used to make a lamp filament, which may be incorporated into an electrical device, such as an incandescent lamp. Such an incandescent lamp may be used as a light source. FIG. 4A is a side elevation view of an embodiment of a lamp 40 incorporating an embodiment of a photonic-crystal filament made in accordance with an embodiment of the invention. FIG. 4B shows an enlarged detail 14 of a portion of the photonic-crystal filament 10 embodiment. Lamp 40 has a support 60, a transparent envelope 50 secured to the support and forming an enclosure with it, a filament 10 having a metal core portion 20, and inputs 70 and 80 for electrical energy secured to the support and electrically coupled through conductive supports 90 to the filament 10. The metal core portion 20 of the filament is coated with a photonic crystal material which is effective to reduce emission of selected wavelengths of electromagnetic radiation during the resistance heating of the filament when electrical energy is conducted to the input and to the metal core portion of the filament.

In such electrical device embodiments, as in other embodiments described herein, the selected wavelengths of radiation may comprise selected infrared wavelengths, and the photonic crystal material has a photonic band-gap corresponding to the selected infrared wavelengths. In such electrical device embodiments, the metal core portion of the filament has a longitudinal axis 30 as shown in FIG. 4B, the photonic crystal material has crystallographic axes, and a selected one of the crystallographic axes of the photonic crystal material may be aligned substantially parallel to the longitudinal axis 30 of the metal core portion 20 of the filament 10, as described above.

Another aspect of embodiments of the invention is a method of cladding a metal filament. Such a method embodiment includes the steps of providing a metal filament, mixing a slurry comprising particles of uniform size and a precursor material for a desired metal, compressing the slurry, urging the metal filament and the compressed slurry through an orifice to force the particles and precursor material into a combination having a desired crystal configuration surrounding the metal filament, drying the combination emerging from the orifice, heating the dried combination to remove the particles while sintering the precursor material, and compressing the precursor material within a sheath, while drawing the filament through a series of two or more successively smaller dies, whereby the filament is clad with a photonic crystal. As in the other method embodiments described, the particles may comprise an inert material and the precursor material may comprise a metal oxide.

Another aspect of embodiments of the invention is a photonic crystal for covering a filament core. The photonic crystal may comprise a first refractory metal substantially filling interstitial spaces between a set of substantially spherical voids disposed in a predetermined crystallographic lattice. The set of spherical voids are disposed surrounding the filament core. Thus the photonic crystal surrounds the filament core. The filament core may comprise a second refractory metal, which may be the same metal as the first refractory metal, or the first and second refractory metals may comprise different metals. For example, the first and/or second refractory metals may comprise tungsten. The filament core has a longitudinal axis, and the predetermined crystallographic lattice may be aligned parallel to the longitudinal axis of the filament core.

Another aspect of embodiments of the invention is a method of using a photonic crystal to reduce emission of selected wavelengths of radiation from a filament. Such a method embodiment may include the steps of providing a core filament and an electrical input connected to the core filament, and cladding the core filament with a photonic crystal material which is operable to reduce emission of selected wavelengths of radiation during the resistance heating of the filament when electrical energy is conducted to the input and to the core filament.

In these method embodiments, as in others described herein that utilize a core filament, the core filament has a longitudinal axis 30 and the photonic crystal material has crystallographic axes. Thus, such methods may further include the step of aligning a crystallographic axis of the photonic crystal material parallel to the longitudinal axis 30 of the core filament, as described above. Those skilled in the art will recognize that some crystal structures of photonic crystals have anisotropic bandgaps, and that the crystallographic orientation in such cases may be chosen to optimize the bandgap for a particular application.

Yet another aspect of embodiments of the invention is a method for filtering light from a light source having a longitudinal axis. Embodiments of such a method may include the step of providing a photonic crystal having a predetermined crystallographic axis and a photonic band-gap adapted to block selected wavelengths of light. Such embodiments may also include a step of surrounding the light source with the photonic crystal while aligning the predetermined crystallographic axis parallel to the longitudinal axis of the light source.

From another point of view, another aspect of embodiments of the invention is a filament including a combination of an elongated filamentary portion performing the function of emitting radiation in a range of wavelengths in response to resistance heating and a filtering portion surrounding the filamentary portion for performing a filtering function. The filtering portion comprises a photonic crystal disposed surrounding the filamentary portion for emitting radiation. The photonic crystal has a band-gap adapted to reduce the emission of selected wavelengths at least partially within the range of wavelengths.

INDUSTRIAL APPLICABILITY

The methods and apparatus of the present invention are useful for fabricating photonic-crystal filaments having desired emission properties and for modifying filaments for improved properties. The methods and apparatus are also useful for electrical devices such as light sources incorporating such photonic-crystal filaments. The devices may be made by methods adapted for mass production with high yield and relatively low cost. Some limited defects of crystal structure (such as those defects occurring at grain boundaries) do not significantly impair the performance of the photonic-crystal filaments.

Although the foregoing has been a description and illustration of specific embodiments of the invention, various modifications and changes thereto can be made by persons skilled in the art without departing from the scope and spirit of the invention as defined by the following claims. For example, the order of process steps may be varied. For another example, photonic-crystal filaments made in accordance with the invention may have anisotropic electromagnetic emission properties, with emission varying according to the band-gaps for electromagnetic wave propagation along various crystallographic directions of the photonic crystal.

What is claimed is:

1. A method for forming a photonic-crystal filament, the method comprising the steps of:

a) mixing a slurry comprising particles of substantially uniform size and a precursor material for a desired metal;
b) urging the slurry through an orifice while forcing the particles and precursor material into a combination having a desired crystallographic configuration;
c) drying the combination having a desired crystallographic configuration emerging from the orifice; and
d) sintering the precursor material, whereby a photonic-crystal filament is formed.

2. A photonic-crystal filament made by the method of claim 1.

3. The method of claim 1, further comprising the step of:
e) compressing the slurry.

4. The method of claim 1, further comprising the step of:
f) heating the dried combination to remove the particles.

5. The method of claim 4, wherein the heating step f) and the sintering step d) are performed simultaneously.

6. The method of claim 1, wherein the particles comprise an inert material.

7. The method of claim 1, wherein the precursor material comprises a metal oxide.

8. The method of claim 1, further comprising the step of:
g) reducing the precursor material to metallic form.

9. The method of claim 8, wherein step g) of reducing the precursor material comprises heating the precursor material in a reducing environment.

10. The method of claim 9, wherein the reducing environment comprises a gas selected from the list consisting of hydrogen, forming gas, a carbide gas, acetylene, and mixtures thereof.

11. The method of claim 1, wherein the desired metal is a refractory metal.

12. The method of claim 11, wherein the refractory metal is selected from the list consisting of tungsten, platinum, tantalum, molybdenum, and alloys thereof.

13. The method of claim 1, wherein the desired metal is tungsten or an alloy thereof.

14. The method of claim 1, wherein the precursor material comprises an oxide of tungsten.

15. The method of claim 1, wherein the precursor material comprises peroxopolytungstic acid.

16. The method of claim 1 wherein the particles comprise substantially spherical particles.

17. The method of claim 1 wherein the particles comprise non-spherical particles.

18. The method of claim 1 wherein the particles comprise polymer particles.

19. The method of claim 1 wherein the particles comprise polymer nanospheres.

20. The method of claim 19, wherein the polymer particles comprise a material selected from the list consisting of polystyrene, polyethylene, polymethylmethacrylate (PMMA), latex, and combinations thereof.

21. The method of claim 1, wherein the photonic-crystal filament has a desired photonic band-gap, and the substantially uniform size of the particles is adapted to provide the desired photonic band-gap.

22. The method of claim 1, wherein the photonic-crystal filament has a longitudinal axis and a selected crystallographic axis of the desired crystallographic configuration is aligned parallel to the longitudinal axis of the photonic-crystal filament.

23. A lamp filament made by the method of claim 1.

24. An incandescent lamp comprising a photonic-crystal filament made by the method of claim 1.

25. A light source comprising the incandescent lamp of claim 24.

26. A method of cladding a metal filament, the method comprising the steps of:
a) providing a metal filament;
b) mixing a slurry comprising particles of substantially uniform size and a precursor material for a desired metal;
c) urging the metal filament and the slurry through an orifice while forcing the particles and precursor material into a combination having a desired crystal configuration surrounding the metal filament;
d) drying the combination having the desired crystallographic configuration emerging from the orifice;
e) sintering the precursor material; and
f) compressing the precursor material within a sheath, while drawing the filament and sheath through a series of two or more successively smaller dies, whereby the filament is clad with a photonic crystal.

27. The clad filament formed by the cladding method of claim 26.

28. The method of claim 26, further comprising the step of:
g) compressing the slurry.

29. The method of claim 26, further comprising the step of:
h) heating the dried combination to remove the particles.

30. The method of claim 29, wherein the heating step h) and the sintering step e) are performed simultaneously.

31. The method of claim 26, wherein the particles comprise an inert material.

32. The method of claim 26, wherein the precursor material comprises a metal oxide.

33. A method for filtering light from a light source having a longitudinal axis, comprising the steps of:
a) providing a photonic crystal having a predetermined crystallographic axis and a photonic band-gap adapted to block selected wavelengths of light; and
b) surrounding the light source with the photonic crystal while aligning the predetermined crystallographic axis parallel to the longitudinal axis of the light source.

* * * * *